US010316401B2

(12) United States Patent
Liu

(10) Patent No.: US 10,316,401 B2
(45) Date of Patent: Jun. 11, 2019

(54) VACUUM EVAPORATION DEVICE

(71) Applicant: BOE TECHNOLOGY GROUP CO., LTD., Beijing (CN)

(72) Inventor: Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 140 days.

(21) Appl. No.: 14/437,049

(22) PCT Filed: Jul. 21, 2014

(86) PCT No.: PCT/CN2014/082611
§ 371 (c)(1),
(2) Date: Apr. 20, 2015

(87) PCT Pub. No.: WO2015/062311
PCT Pub. Date: May 7, 2015

(65) Prior Publication Data
US 2016/0010203 A1 Jan. 14, 2016

(30) Foreign Application Priority Data
Oct. 30, 2013 (CN) .......................... 2013 1 0526932

(51) Int. Cl.
C23C 16/00 (2006.01)
C23C 14/24 (2006.01)
C23C 14/04 (2006.01)

(52) U.S. Cl.
CPC ............ C23C 14/24 (2013.01); C23C 14/044 (2013.01)

(58) Field of Classification Search
CPC .............................. C23C 14/24; C23C 14/044
(Continued)

(56) References Cited

U.S. PATENT DOCUMENTS 3,206,322 A * 9/1965 Morgan ................ C23C 14/042
118/504
3,520,716 A * 7/1970 Okamoto .............. C23C 14/042
118/720
(Continued)

FOREIGN PATENT DOCUMENTS

CN 1896846 A 1/2007
CN 101280418 A 10/2008
(Continued)

OTHER PUBLICATIONS

International Search Report dated Oct. 24, 2014 issued in International Application No. PCT/CN2014/082611.
(Continued)

Primary Examiner — Keath T Chen
(74) Attorney, Agent, or Firm — Nath, Goldberg & Meyer; Joshua B. Goldberg

(57) ABSTRACT

The invention provides a vacuum evaporation device, belongs to the field of vacuum evaporation and can solve the problem of non-uniform thickness of a coating film formed by an existing vacuum evaporation device. The vacuum evaporation device provided by the present invention comprises an evaporation chamber, at least one evaporation source device disposed in the evaporation chamber, and a baffle assembly disposed between the evaporation source device and a substrate to be evaporated. The evaporation source device is disposed within the center region of a base plate of the evaporation chamber. The baffle assembly is provided with a baffle assembly opening used for allowing evaporation substances to pass therethrough and corresponding to the position of the evaporation source device. As the evaporation source device is disposed within the center region of the evaporation chamber, the thickness of a coating film formed on the surface of the substrate is more uniform.

7 Claims, 3 Drawing Sheets

(58) Field of Classification Search
USPC .................................................. 118/726, 727
See application file for complete search history.

(56) References Cited

U.S. PATENT DOCUMENTS

| | | | | |
|---|---|---|---|---|
| 3,617,331 | A * | 11/1971 | Illsley | C23C 14/044 |
| | | | | 359/359 |
| 3,664,295 | A * | 5/1972 | Ng | C23C 14/044 |
| | | | | 118/712 |
| 3,861,353 | A * | 1/1975 | Erhart | C23C 14/505 |
| | | | | 118/725 |
| 4,016,310 | A * | 4/1977 | Ing | C23C 14/243 |
| | | | | 427/124 |
| 4,478,174 | A * | 10/1984 | Ranger | C23C 14/56 |
| | | | | 118/718 |
| 2003/0194484 | A1 * | 10/2003 | Yamazaki | C23C 14/24 |
| | | | | 427/66 |
| 2005/0263074 | A1 * | 12/2005 | Masuda | C23C 14/12 |
| | | | | 118/726 |
| 2006/0204648 | A1 * | 9/2006 | Lee | C23C 14/56 |
| | | | | 427/8 |
| 2009/0279227 | A1 * | 11/2009 | Ha | H01G 4/008 |
| | | | | 361/301.4 |
| 2011/0052796 | A1 * | 3/2011 | Gross | C23C 14/12 |
| | | | | 427/74 |

FOREIGN PATENT DOCUMENTS

| | | |
|---|---|---|
| CN | 201785478 U | 4/2011 |
| CN | 202139291 U | 2/2012 |
| CN | 103160788 A | 6/2013 |
| CN | 103540898 A | 1/2014 |
| CN | 203639542 U | 6/2014 |
| JP | 60-067662 A | 4/1985 |
| JP | 2006177702 A | 7/2006 |
| JP | 2010531391 A | 9/2010 |
| KR | 20100108086 A | 10/2010 |
| KR | 20110033664 A | 3/2011 |
| WO | 2011/116563 A1 | 9/2011 |

OTHER PUBLICATIONS

Chinese Office Action dated Feb. 28, 2015 issued in corresponding Chinese Application No. 201310526932.5.

* cited by examiner

VACUUM EVAPORATION DEVICE

This is a National Phase Application filed under 35 U.S.C. 371 as a national stage of PCT/CN2014/082611 filed on Jul. 21, 2014, an application claiming the benefit to Chinese application No. 201310526932.5 filed on Oct. 30, 2013; the content of each of which is hereby incorporated by reference in its entirety.

FIELD OF THE INVENTION

The present invention relates to the technical field of vacuum evaporation, and particularly relates to a vacuum evaporation device.

BACKGROUND OF THE INVENTION

As shown in FIG. 1, a vacuum evaporation device in the prior art includes an evaporation chamber 5 and a base plate 1 located at the lower part of the evaporation chamber 5. A substrate 4 to be evaporated is placed at the upper part of the evaporation chamber 5. An evaporation source device 10 is provided at the edge part of the base plate 1. A baffle 3 is provided at the middle part of the evaporation chamber 5. A baffle opening 31 is formed in the baffle 3, and the position of the baffle opening 31 corresponds to the position of the evaporation source device 10. During evaporation, the evaporation substance evaporated out from the evaporation source device 10 is deposited on the surface of the substrate 4 through the baffle opening 31.

As shown in FIG. 2, each baffle opening 31 is provided with a baffle opening cover plate 32 capable of moving (or rotating) and covering the baffle opening 31. The baffle opening cover plate 32 is used for occluding the baffle opening 31 when the evaporation source device 10 is at a preheated state, so that the evaporation substance evaporated out from the evaporation source device 10 is prevented from polluting the inner surface of the evaporation chamber 5.

However, as the baffle opening 31 is provided at the edge part of the base plate 1, in accordance with the molecular diffusion free-path principle, this will result in non-uniform thickness distribution of a coating film deposited on the surface of the substrate 4, and the thickness of the coating film near the evaporation source device 10 is far greater than that of the coating film away from the evaporation source device.

SUMMARY OF THE INVENTION

An objective of the present invention is to solve the problem of non-uniform thickness of a coating film formed by an existing vacuum evaporation device and provide a vacuum evaporation device capable of forming a coating film with uniform thickness.

The technical solution employed to solve the technical problem of the present invention is to provide a vacuum evaporation device, including an evaporation chamber, at least one evaporation source device disposed in the evaporation chamber, and a baffle assembly disposed between the evaporation source device and a substrate to be evaporated onto, wherein the at least one evaporation source device is disposed within the center region of a base plate of the evaporation chamber, and the baffle assembly is provided with a baffle assembly opening used for allowing evaporation substances to pass therethrough and corresponding to the position of the at least one evaporation source device.

In the vacuum evaporation device provided by the present invention, as the evaporation source device is disposed within the center region of the base plate of the evaporation chamber, the thickness of a coating film formed on the surface of the substrate is more uniform.

Preferably, the size and/or shape of the baffle assembly opening are/is adjustable.

Further preferably, the baffle assembly includes at least two baffles located at different positions in the height direction of the evaporation chamber, each of the baffles being provided with an opening and being able to move along the horizontal direction, the baffle assembly opening being formed at the overlapped position of the openings of the baffles.

Preferably, each evaporation source device includes at least two movable point evaporation sources, and the point evaporation sources can be moved to a position corresponding to the baffle assembly opening.

Further preferably, each evaporation source device further includes a movable carriage for carrying the point evaporation sources.

Further preferably, the carriage is disc-shaped and can rotate around its center, and the point evaporation sources are distributed at equal intervals along the circumference of the disc-shaped carriage.

Preferably, there are three evaporation source devices, the carriages of the evaporation source devices are identical in diameter, and the circumference of each carriage is externally tangent to the circumferences of the other two carriages.

Preferably, each of the carriages is strip-shaped, each evaporation source device further comprises a straight guide rail parallel to the strip-shaped carriage, and the strip-shaped carriage is able to move along the straight guide rail.

Further preferably, there are multiple evaporation source devices, and the straight guide rails of the evaporation source devices are parallel to one another and arranged side by side.

Further preferably, the point evaporation sources are arranged at equal intervals in the length direction of the strip-shaped carriages.

As in the vacuum evaporation device provided by the present invention, the baffle assembly opening is located at the middle part of the evaporation chamber; the thickness of the coating film deposited on the surface of the substrate is more uniform.

Secondly, as there are multiple point evaporation sources, and the point evaporation sources can be moved under the baffle assembly opening alternately, the doped evaporation of two or more substances may be realized by selecting the point evaporation sources capable of evaporating out different evaporation substances. Meanwhile, the distance between the point evaporation sources during working is relatively small, so it is more approximate to single-point evaporation, and it is advantageous for the same proportion of doped components of the doped coating film.

Finally, as the size of the baffle assembly opening is adjustable, the point evaporation sources for doped evaporation performs evaporation from the same baffle assembly opening, which is as small as possible, so that the doped components of the doped coating film formed on the surface of a substrate are in the same proportion. The same proportion of the doped components is of vital importance to the performance of the doped coating film, so the uniformity of the performance of the doped coating film on the whole surface of the substrate is ensured.

in the figures: 1—Base plate; 3—Baffle; 31—Baffle opening; 32—Baffle opening cover plate; 4—Substrate; 5—Evaporation chamber, 10—Evaporation source device; 11—Point evaporation source; 12—Carriage; 20—Baffle assembly; 200—Baffle assembly opening; 21—First baffle; 22—Second baffle; 210—First baffle opening; and, 220—Second baffle opening.

DETAILED DESCRIPTION OF THE EMBODIMENTS

To make those skilled in the art better understand the technical solutions of the present invention, the present invention will be further described below in details with reference to the accompanying drawings and specific implementations.

Embodiment

Figure 1:
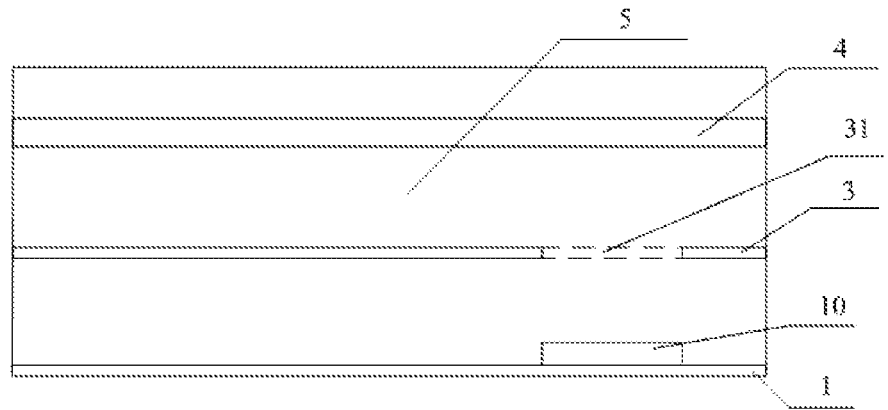
FIG. 1 is a schematic diagram of a longitudinal cross-section of a vacuum evaporation device in the prior art.
Figure 2:
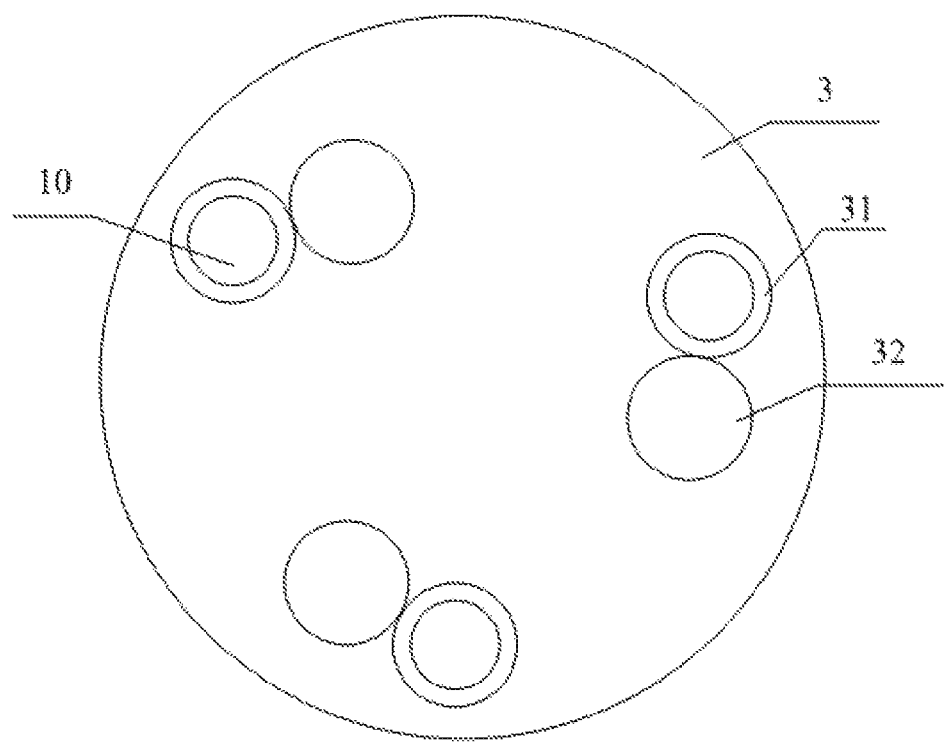
FIG. 2 is a top view of a vacuum evaporation device in the prior art from a perspective of the inferior of a substrate.
Figure 3:
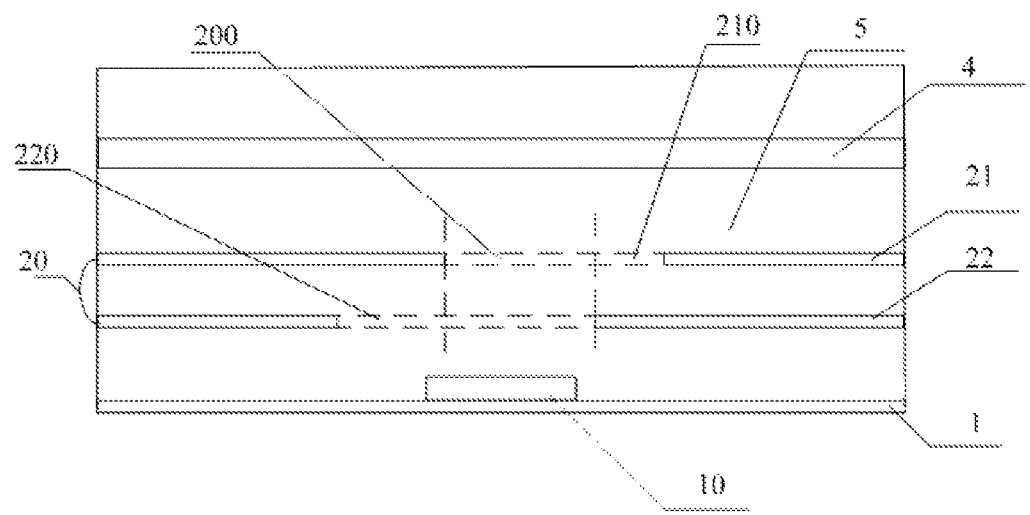
FIG. 3 is a schematic diagram of a longitudinal cross-section of a vacuum evaporation device in an embodiment of the present invention.
Figure 4:
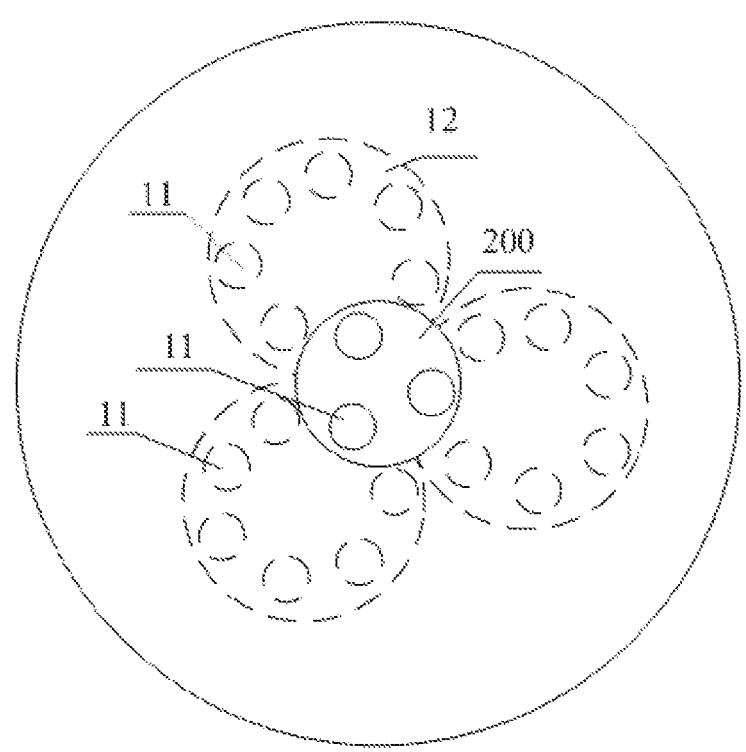
FIG. 4 is a top view of a vacuum evaporation device with rotatable and movable point evaporation sources in an embodiment of the present invention from a perspective of the inferior of a substrate.
Figure 5:
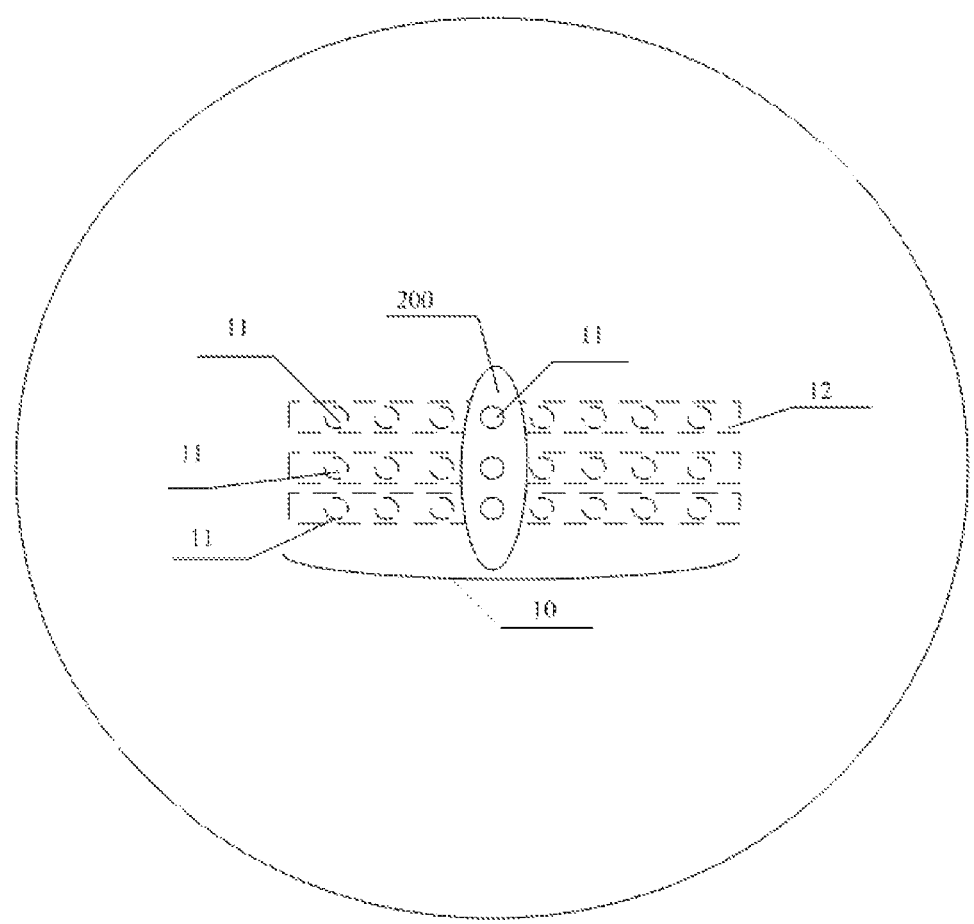
FIG. 5 is a top view of a vacuum evaporation device with straightly movable point evaporation sources in an embodiment of the present invention from a perspective of the inferior of a substrate.

As shown in FIGS. 3-5, this embodiment provides a vacuum evaporation device.

As shown in FIG. 3, the vacuum evaporation device includes an evaporation chamber 5, a base plate 1 disposed at the lower part of the evaporation chamber 5, at least one evaporation source device 10 disposed within the center region of the base plate 1, and a baffle assembly 20 disposed inside the evaporation chamber 5 and used for preventing evaporation substances from polluting the inner surface of the evaporation chamber 5. The baffle assembly 20 is provided with a baffle assembly opening 200 corresponding to the position of the at least one evaporation source device 10. The evaporation source device 10 is used for evaporating out evaporation substances.

A substrate 4 to be evaporated is disposed at the upper part of the evaporation chamber 5. The evaporation substances evaporated out from the at least one evaporation source device 10 are deposited on the whole surface of the substrate 4 through the baffle assembly opening 200. The size of the baffle assembly opening 200 is configured to be capable of preventing the evaporation substrates from polluting the inner surface of the evaporation chamber 5.

Preferably, the baffle assembly 20 includes at least two baffles located at different positions in the height direction of the evaporation chamber 5. If the baffle assembly 20 includes two baffles, the two baffles are a first baffle 21 and a second baffle 22 respectively. The first baffle 21 has a first baffle opening 210, and the second baffle 22 has a second baffle opening 220. In this embodiment, the relative positions of the first baffle 21 and the second baffle 22 are not limited. That is, the first baffle 21 may be located above the second baffle 22 (as shown in FIG. 3), or may be located under the second baffle 22.

As shown in FIG. 3, preferably, when the first baffle 21 and the second baffle 22 are moved in the horizontal direction, the baffle assembly opening 200 is formed at the overlapped position of the first baffle opening 210 and the second baffle opening 220. Preferably, the shape of the baffle assembly opening 220 may be circular or oval, etc. The first baffle 21 and the second baffle 22 may be controlled to move separately in the horizontal direction by the transmission of a transmission rod or by electromagnetic transmission, so that the size and/or shape of the formed baffle assembly opening 200 are/is controlled.

Preferably, the first baffle 21 and the second baffle 22 may also be composed of at least two parts respectively. The constituent parts of the first baffle 21 and the second baffle 22 may be controlled to move separately in the horizontal direction by the transmission of a transmission rod or by electromagnetic transmission, so that the size and/or shape of the formed baffle assembly opening 200 are/is controlled.

As shown in FIG. 4, each of the evaporation source devices 10 (the portion blocked by the baffle assembly 20 in FIG. 4 is represented with a dotted line) includes point evaporation sources 11 and a carriage 12 for carrying the point evaporation sources 11. The carriage 12 may be rotated. Preferably, the carriage 12 is disc-shaped and may rotate around its center. The point evaporation sources 11 are distributed along the circumference of the disc-shaped carriage 12. Preferably, the point evaporation sources 11 are distributed at equal intervals on the circumference of the disc-shaped carriage 12, so that it is more convenient to control the disc-shaped carriage 12 to rotate by a motor so as to drive the point evaporation sources 11 to rotate.

As shown in FIG. 4, three disc-shaped carriages 12 are provided within the center region of the base plate 1, and the rotation speed and rotation direction of each of the disc-shaped carriages 12 may be controlled by a motor. Preferably, 7 point evaporation sources 11 are borne on each of the disc-shaped carriages 12, and each of the point evaporation sources 11 has independently controlled heating and cooling devices. Doped evaporation or non-doped evaporation is realized by controlling the time sequence of the point evaporation sources 11.

Preferably, the three disc-shaped carriages 12 are identical in diameter, and the circumference of each of the disc-shaped carriages 12 is externally tangent to the circumferences of the other two disc-shaped carriages, so that three point evaporation sources 11 may be simultaneously exposed by a relatively small baffle assembly opening 200, and the distance between the point evaporation sources 11 on each of the disc-shaped carriages 12 is closer. Accordingly, the evaporation substances evaporated out from the close point evaporation sources 11 are more approximately evaporated out from a single point, and it is advantageous for the same proportion of the doped components of a coating film on the surface of the substrate 4.

It may be understood that, the number of the evaporation source devices 10 may be determined according to specific application situations. The size of the baffle assembly opening 200 is related to the number of the point evaporation sources 11 to be evaporated. The size of the baffle assembly opening 200 may be adjusted to expose all the point evaporation sources 11 to be evaporated. By controlling the rotation speed of the disc-shaped carriages 12 and the preheating speed of the point evaporation sources 11, the preheating of the next point evaporation source 11 to be evaporated is completed while the evaporation of the current point evaporation source 11 is finished, so that the evaporation source devices 10 may perform evaporation continuously, and the time of evaporation is thus saved.

As shown in FIG. 5, each of the evaporation source devices 10 (the portion blocked by the baffle assembly 20 in FIG. 5 is represented with a dotted line) includes point evaporation sources 11 and a strip-shaped carriage 12 for carrying the point evaporation sources 11. The strip-shaped carriage 12 may be moved along the length direction thereof. For example, the strip-shaped carriage 12 may be moved on a straight guide rail (not shown because it is blocked by the strip-shaped carriage 12 in FIG. 5), and the strip-shaped carriage 12 and the straight guide rail are arranged in parallel.

Preferably, three strip-shaped carriages 12 are disposed on three parallel straight guide rails (blocked by the carriages 12). Preferably, the three strip-shaped carriages 12 are provided within the center region of the base plate 1. The strip-shaped carriages may be controlled to make a linear motion along the straight rails by a motor, so that the point evaporation sources 11 to be evaporated are moved under the baffle assembly opening 200 for evaporation. Preferably, the point evaporation sources 11 are arranged at equal intervals in the length direction of the strip-shaped carriages 12, so that it is more convenient to control the strip-shaped carriages 12 to make a linear motion along the straight guide rails by a motor so as to drive the point evaporation sources 11 to make a linear motion.

It may be understood that, the number of the straight guide rails may be determined according to specific application situations. The size of the baffle assembly opening 200 is related to the number of the point evaporation sources 11 to be evaporated. The size of the baffle assembly opening 200 may be adjusted to expose all the point evaporation sources 11 to be evaporated. By controlling the moving speed of the strip-shaped carriages 12 and the preheating speed of the point evaporation sources 11, the preheating of the next point evaporation source 11 to be evaporated is completed while the evaporation of the current point evaporation source 11 is finished, so that the evaporation source devices 10 may perform evaporation continuously, and the time of evaporation is thus saved.

The usage methods of the above vacuum evaporation devices of different structures are similar. The single evaporation of a single point evaporation source 11 on a single evaporation source device 10 may be realized, as long as there is an evaporation source device 10 with a single point evaporation source 11. Correspondingly, the baffle assembly opening 200 may become smaller by moving the baffles in the horizontal direction. The simultaneous evaporation or alternate evaporation of multiple point evaporation sources 11 on a single evaporation source device 10 may also be realized, as long as there is an evaporation source device 10 with multiple point evaporation sources 11. The simultaneous evaporation or alternate evaporation of single point evaporation sources 11 on multiple evaporation source devices 10 may also be realized, as long as there are multiple evaporation source devices 10 and single evaporation sources 11 respectively disposed on each of the evaporation source devices 10. The simultaneous evaporation or alternate evaporation of multiple point evaporation sources 11 on multiple evaporation source devices 10 may also be realized, as long as there are multiple evaporation source devices 10 and multiple point evaporation sources 11 disposed on each of the evaporation source devices 10. Correspondingly, the size and/or shape of the baffle assembly opening 200 may be adjusted by moving the baffles in the horizontal direction. It may be understood that those skilled in the art may adjust the usage methods of the vacuum evaporation device according to application situations.

In the vacuum evaporation device provided by this embodiment, the baffle assembly opening is located at the middle part of the evaporation chamber, so the thickness of the coating film deposited on the surface of the substrate is more uniform. Secondly, as there are multiple point evaporation sources, and the point evaporation sources are moved to be under the baffle assembly opening alternately, the doped evaporation of two or more substances may be realized by selecting the point evaporation sources capable of evaporating out different evaporation substances. Meanwhile, the distance between the point evaporation sources during working is relatively small, so they are more approximate to a single-point evaporation, and it is advantageous for the same proportion of doped components of the doped coating film. Finally, as the size of the baffle assembly opening is adjustable, the point evaporation sources for doped evaporation performs evaporation from the same baffle assembly opening, which is as small as possible, so that the doped components of the doped coating film formed on the surface of a substrate are in the same proportion. The same proportion of the doped components is of vital importance to the performance of the doped coating film, so the uniformity of the performance of the doped coating film on the whole surface of the substrate is ensured.

It may be understood that, the forgoing implementations are merely exemplary implementations for describing the principle of the present invention, but the present invention is not limited thereto. A person of ordinary skill in the art may make various variations and improvements without departing from the spirit and essence of the present invention, and these variations and improvements are also deemed as falling into the protection scope of the present invention.

The invention claimed is:

1. A vacuum evaporation device, comprising an evaporation chamber, at least two evaporation source devices disposed in the evaporation chamber, and a baffle assembly disposed between the at least two evaporation source devices and a substrate to be deposited, wherein:

the at least two evaporation source devices are disposed within the center region of a base plate of the evaporation chamber; and the baffle assembly comprises at least two baffles located at different positions in a height direction of the evaporation chamber and is provided with a baffle assembly opening used for allowing evaporation substances to pass therethrough and corresponding to the position of the at least two evaporation source devices, each of the at least two baffles being provided with an opening and being able to move along the horizontal direction, the baffle assembly opening being formed at an overlapped position of the openings of the at least two baffles such that the size and/or shape of the baffle assembly opening are/is adjustable, and each of the at least two evaporation source devices comprises at least two movable point evaporation sources so that the at least two evaporation source devices each have one movable point evaporation source simultaneously exposed by the baffle assembly opening at a position corresponding to the baffle assembly opening during evaporation to obtain a desired evaporation pattern.

2. The vacuum evaporation device according to claim 1, wherein each evaporation source device of the at least two evaporation source devices further comprises a movable carriage for carrying the at least two movable point evaporation sources comprised in the evaporation source device.

3. The vacuum evaporation device according to claim 2, wherein each movable carriage is disc-shaped and can rotate around its center, and the at least two movable point evaporation sources comprised in the evaporation source device are distributed at equal intervals along a circumference of each movable carriage.

4. The vacuum evaporation device according to claim 3, wherein there are three evaporation source devices, the movable carriages of the three evaporation source devices are identical in diameter, and the circumference of each movable carriage is externally tangent to the circumferences of the other two movable carriages.

5. The vacuum evaporation device according to claim 2, wherein each movable carriage is strip-shaped, each of the at least two evaporation source devices further comprises a straight guide rail parallel to the movable carriage, and the movable carriage is able to move along the straight guide rail.

6. The vacuum evaporation device according to claim 5, wherein the straight guide rails of the at least two evaporation source devices are parallel to one another and arranged side by side.

7. The vacuum evaporation device according to claim 6, wherein the at least two movable point evaporation sources comprised in the evaporation source device are arranged at equal intervals in a length direction of each movable carriage.

* * * * *